: US 6,566,752 B2
(12) United States Patent
Hsia et al.

(10) Patent No.: US 6,566,752 B2
(45) Date of Patent: May 20, 2003

(54) BONDING PAD AND METHOD FOR MANUFACTURING IT

(75) Inventors: Chin Chiu Hsia, Taipei (TW); Bing-Yue Tsui, Hsinchu (TW); Tsung-Ju Yang, Hsinchu (TW); Tsung Yao Chu, Taipei (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 10/170,124

(22) Filed: Jun. 12, 2002

(65) Prior Publication Data

US 2002/0149115 A1 Oct. 17, 2002

Related U.S. Application Data

(62) Division of application No. 09/713,801, filed on Nov. 16, 2000, now Pat. No. 6,426,555.

(51) Int. Cl.$^7$ .............................................. H01L 29/40
(52) U.S. Cl. ........................ 257/734; 257/700; 257/758; 257/779; 257/780; 257/781; 257/782
(58) Field of Search ................................ 257/700, 734, 257/758, 779, 780, 781, 782; 438/612, 702, 693

(56) References Cited

U.S. PATENT DOCUMENTS

| | | | |
|---|---|---|---|
| 5,149,674 A | 9/1992 | Freeman, Jr. et al. | 437/195 |
| 5,284,797 A | 2/1994 | Heim | 437/183 |
| 5,661,081 A | 8/1997 | Hsue et al. | 438/106 |
| 5,700,735 A | 12/1997 | Shiue et al. | 438/612 |
| 5,707,894 A * | 1/1998 | Hsiao | 438/614 |
| 5,736,791 A * | 4/1998 | Fujiki et al. | 257/781 |
| 5,834,365 A | 11/1998 | Ming-Tsung et al. | 438/612 |
| 6,163,074 A * | 12/2000 | Lee et al. | 257/734 |
| 6,198,170 B1 * | 3/2001 | Zhao | 257/784 |
| 6,222,270 B1 * | 4/2001 | Lee | 257/758 |
| 6,245,683 B1 * | 6/2001 | Liu | 438/702 |
| 6,388,331 B1 * | 5/2002 | Bond et al. | 257/773 |
| 6,448,641 B2 * | 9/2002 | Ker et al. | 257/700 |

* cited by examiner

*Primary Examiner*—Michael S. Lebentritt
*Assistant Examiner*—Doug Menz
(74) *Attorney, Agent, or Firm*—George O. Saile; Stephen B. Ackerman

(57) ABSTRACT

A bonding pad that has low parasitic capacitance and that transmits little or no stress to the underlying metal layer during bonding, along with a process for manufacturing it, is described. A key feature of this structure is that the damascene wiring directly below the bonding pad has been limited to its outer edges, that is it is formed in the shape of a hollow square. This limits overlap by the aluminum pad of the damascene wiring to the via hole area only. After a passivation layer, including suitable diffusion barriers, has been laid over the structure, it is over-filled with a suitable soft metal (typically copper or one of its alloys) and then planarized in the usual way. A via hole for communicating with the damascene wiring is then formed. This via can take the shape of a somewhat smaller hollow square or it can be formed from a series of individual vias arranged in the shape of a broken hollow square.

10 Claims, 3 Drawing Sheets

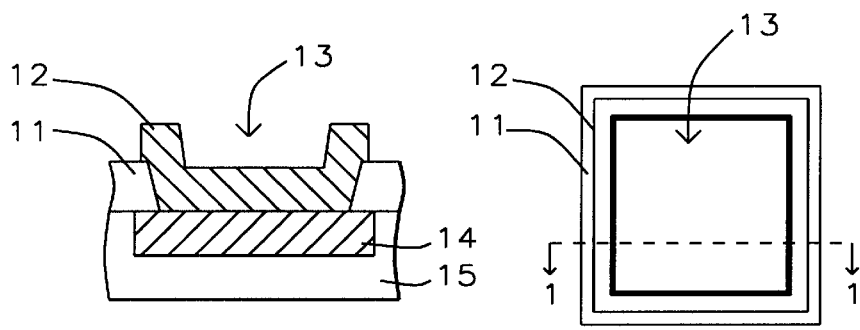
FIG. 1 – (Prior Art)   FIG. 2 – (Prior Art)
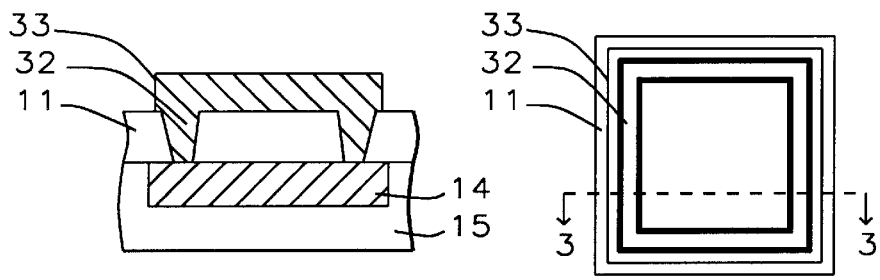
FIG. 3 – (Prior Art)   FIG. 4 – (Prior Art)
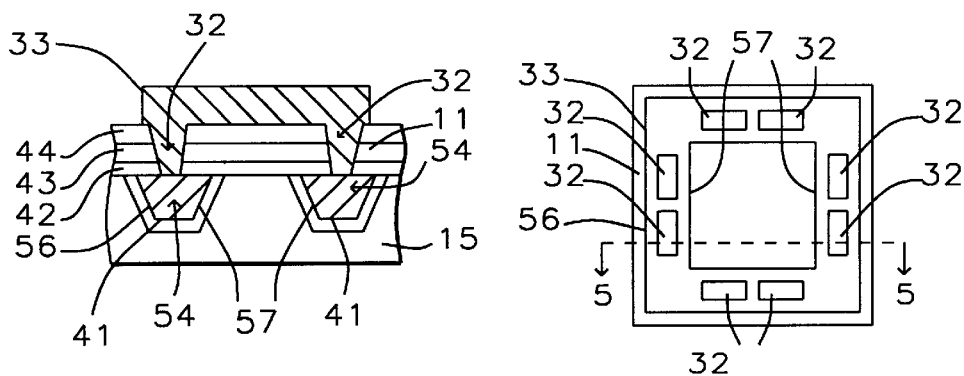
FIG. 5   FIG. 6

BONDING PAD AND METHOD FOR MANUFACTURING IT

This is a division of patent application Ser. No. 09/713,801, filing date Nov. 16, 2000, which is now U.S. Pat. No. 6,426,555, issued Jul. 30, 2002, Bonding Pad And Method For Manufacturing It, assigned to the same assignee as the present invention.

FIELD OF THE INVENTION

The invention relates to the general field of integrated circuit manufacture with particular reference to forming bonding pads.

BACKGROUND OF THE INVENTION

Bonding pads, where connection is made between integrated circuits and the outside world, come in a variety of designs. A typical straightforward design of the prior art is illustrated in FIG. 1. Damascene conductor 14 was previously embedded in the upper surface of dielectric layer 14 and then covered with a second (usually a passivating) layer 11. Via hole 13 was then etched in 11, to expose a portion of 14, and aluminum bonding pad 12 was deposited and patterned so that it filled via hole 13 and overlapped its edges somewhat. FIG. 2 is a plan view of this structure, with FIG. 1 being a section taken at 1—1 of FIG. 2.

While this type of design is easy to fabricate, it has the disadvantage that it is also associated with both a large area pad as well as a large underlying damascene area. This results in a large parasitic capacitance.

One approach to insulating the underlying metal from the bonding pad has been described by Heim in U.S. Pat. No. 5,284,797. Heim's structure is shown in FIG. 3. The structure of the underlying damascene conductor 14 is seen to be the same as in the structure of FIG. 1, but, instead of making contact all over its surface, via hole communication is confined to the outer edges of bonding pad 33. In this way pressure on pad 33 is not transmitted directly to the underlying conductor 14 but is buffered, at least to some extent, by the intervening dielectric layer 11. FIG. 4 is a plan view of the structure with FIG. 3 being a cross-section taken at 3—3.

Other references of interest include Shiue et al. (U.S. Pat. No. 5,700,735) who show a bonding pad with via plugs connecting between the first and second metal pads, Freeman, Jr et al. (U.S. Pat. No. 5,149,674) who describe a multi-layer bonding pad, and Hsue et al. (U.S. Pat. No. 5,661,081) who teach a bonding pad optimized to prevent peeling. Peeling prevention is also the main feature of the design by Ming-Tsung et al. (U.S. Pat. No. 5,834,365) who disclose a bond pad with strips/irregular surface.

SUMMARY OF THE INVENTION

It has been in object of the present invention to provide a bonding pad that protects the damascene conductor from damage during electrical probing and wire bonding.

A further object of the invention has been to provide a bond pad structure that has a low parasitic capacitance.

Another object of the invention has been to provide a process for manufacturing said bonding pad.

These objects have been achieved by limiting the damascene wiring directly below the bonding pad to its outer edges, that is forming it in the shape of a hollow square. It is over-filled with a suitable soft metal (typically copper or one of its alloys) and then planarized in the usual way. After a passivation layer, including suitable diffusion barriers, has been laid over the structure, a via hole for communicating with the damascene wiring is then formed. This via can take the shape of a somewhat smaller hollow square or it can be formed from a series of individual vias arranged in the shape of a broken hollow square.

BRIEF DESCRIPTION OF THE DRAWINGS

FIG. 1 is a cross-sectional view of a bonding pad of the prior art.

FIG. 2 is a plan view of the bonding pad shown in FIG. 1.

FIG. 3 is a cross-sectional view of another prior art bonding pad in which communication with the lower-level wiring is limited to the outside edges of the pad.

FIG. 4 is a plan view of the bonding pad shown in FIG. 3.

FIG. 5 is a cross-sectional view of a bonding pad that is a first embodiment of the present invention.

FIG. 6 is a plan view of the bonding pad shown in FIG. 5.

DESCRIPTION OF THE PREFERRED EMBODIMENTS

The present invention will be described through the process that is used to manufacture it. In the course of this description, the structure of the invention will also become apparent.

A key feature of the present invention is that the termination of the conventional damascene conductor is different from the main body. In the two prior art examples shown earlier (FIGS. 1 and 3) conductive layer 14 had a rectangular cross-section all the way to its end, where the bonding pad was to be formed.

Figure 9:
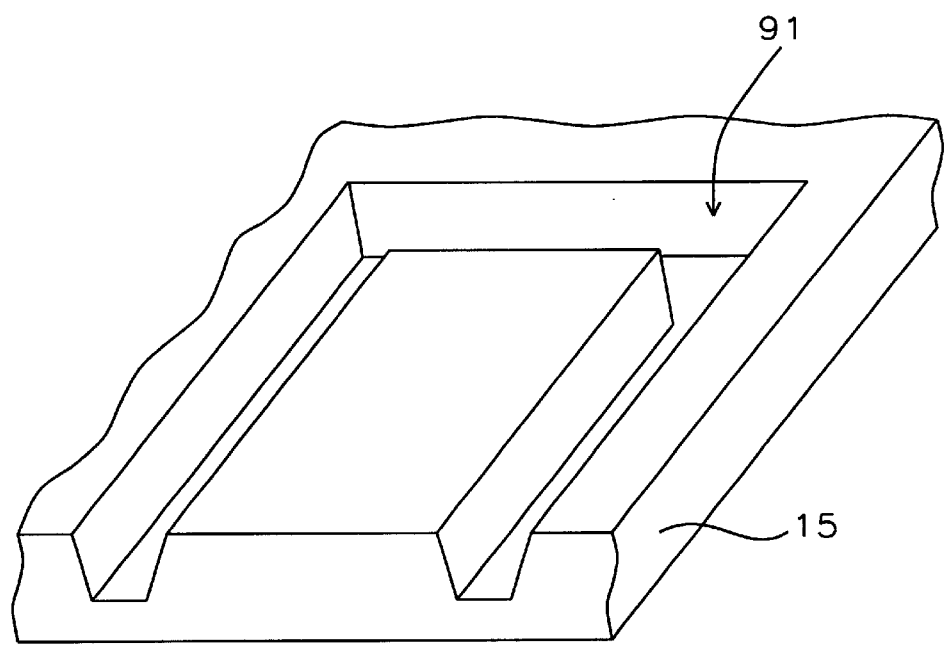
FIG. 9 is an isometric view of a via hole in the shape of a hollow square.

In the present invention, the portion of the damascene conductor that is to be located beneath the bonding pad has the shape of a hollow square. Thus, the first step in the process of the present invention, as illustrated in FIG. 5, is to etch out a trench, having this shape that extends downwards from the surface of dielectric layer 15 towards the main body of the integrated circuit. This trench has a width between about 1 and 10 microns and a depth between about 0.5 and 2 microns. Dielectric layer 15 is usually an IMD (inter-metal dielectric) such as undoped silicate glass, fluorinated silicon glass, or a low k material. An aid to visualizing this structure is provided in FIG. 9 which is an isometric view of a hollow square trench 91 (cut in half), later to be filled with metal to become 54 in FIGS. 5 and 7.

Next, barrier layer 41 is deposited over all exposed surfaces, including the trench. This barrier layer is typically tantalum nitride, but other material such as tantalum, titanium nitride, and tungsten nitride could also have been used. It is deposited to a thickness between about 100 and 1,000 Angstroms. The trench is then overfilled with metal, said metal being usually copper, a copper manganese alloy, or a copper aluminum alloy, following which the surface is planarized (usually by means of chem.-mech. polishing), so that the trench is only just filled with metal. Cap layer 42 is then deposited over the newly planarized surface. This cap layer is typically silicon nitride, but other materials such as silicon carbide could also have been used. It is deposited to a thickness between about 300 and 1,000 Angstroms. The copper-barrier layer interface is shown as 57.

Then, a second dielectric layer (usually a passivating layer) is deposited. Usually, this passivating layer is formed by successive deposition of layer 43 of silicon oxide and layer 44 of silicon nitride. The layer of silicon oxide is deposited to a thickness between about 0.5 and 1 micron while the layer of silicon nitride is between about 0.5 and 1 microns thick.

At this point in the process, two different embodiments of the invention are possible.

The first embodiment is illustrated in FIGS. 5 and 6 with the latter being a plan view and FIG. 5 being a cross-section taken through 5—5. In this embodiment, the via hole has the shape of a broken line hollow square which is positioned so that it lies directly above the previously mentioned hollow square 54. Its width is between about 0.5 and 9 microns so that it is fully overlapped by 54. It extends downwards from the top surface of the passivation layer, i.e. through layers 44, 43, and 42, to expose the metal that fills hollow square 54.

Figure 7:
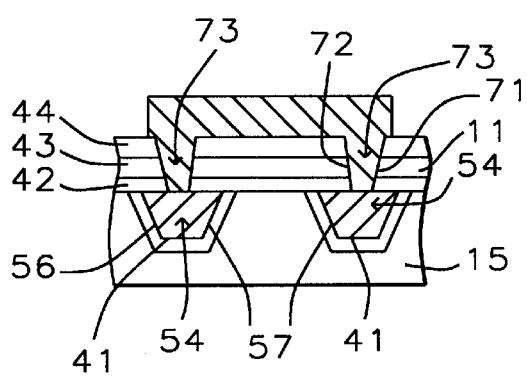
FIG. 7 is a cross-sectional view of a bonding pad that is a second embodiment of the present invention.
Figure 8:
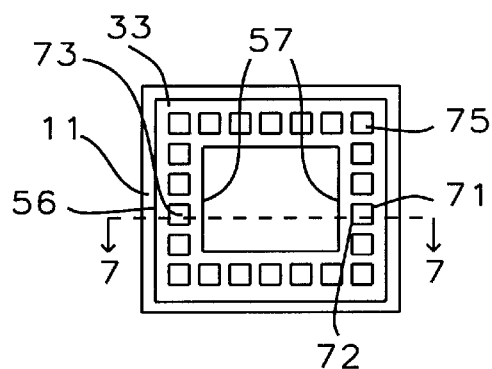
FIG. 8 is a plan view of the bonding pad shown in FIG. 7.

The second embodiment is illustrated in FIGS. 7 and 8 with the latter being a plan view and FIG. 7 being a cross-section taken through 7—7. In this embodiment, the via hole is not a single hole but rather a large number of small via holes (such as 75 in FIG. 8) each of whose widths is less than the width of trench 54, being between about 0.5 and 9 microns. These individual vias are separated from one another by between about and 0.5 and 1 microns and are arranged to form a broken hollow square that lies entirely above, and is fully overlapped by, the afore-mentioned hollow square 54. As in the first embodiment, all the small via holes extend downwards from the top surface of the passivation layer, i.e. through layers 44, 43, and 42, to expose the metal that fills hollow square 54.

At this point the process for preparing either embodiment is again the same. Aluminum layer 33 is deposited (to a thickness between about 0.5 and 2 microns) onto the upper surface of the passivation layer (i.e. the surface layer 44) following which it is patterned and etched to form the bonding pad, which completely fills, as well as fully overlaps, the via hole (32 for the first embodiment and 73 for the second embodiment).

Figure 10:
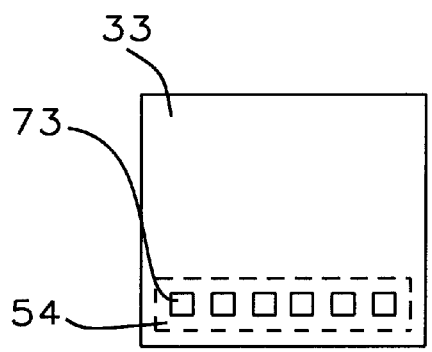
FIGS. 10–12 illustrate additional variations of the basic design.
Figure 11:
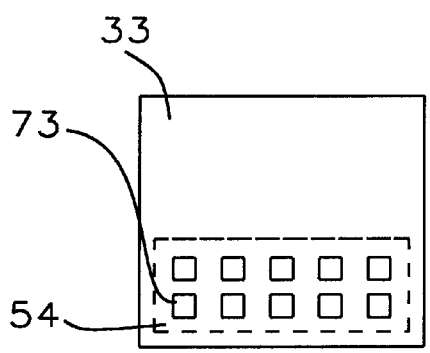
Figure 12:
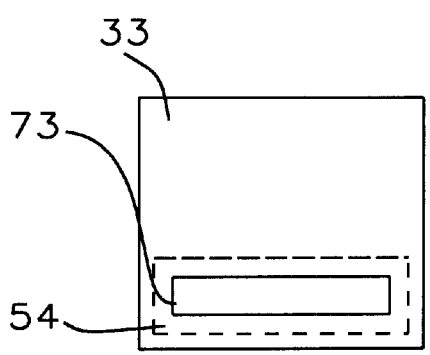

In FIGS. 10, 11, and 12, we show additional examples of bonding pads associated with damascene connectors and designed according to the principles taught by the present invention. In each case aluminum pad 33 overlies damascene connector 54 which it contacts through via holes such as 73. The common key feature is that, although a relatively large bonding pad is used, the amount of overlap between the bonding pad and the damascene area is always very small. This eliminates the large parasitic capacitance associated with designs of the prior art.

While the invention has been particularly shown and described with reference to the preferred embodiments thereof, it will be understood by those skilled in the art that various changes in form and details may be made without departing from the spirit and scope of the invention.

What is claimed is:

1. A bonding pad, comprising:
   a partially completed silicon integrated circuit that includes an uppermost layer of a first dielectric material having a first upper surface;
   a first trench, having a first width, in the shape of a hollow square that extends downwards from said first upper surface to a depth;
   a barrier layer over the upper surface, including the first trench;
   a metal layer that just fills the first trench;
   a cap layer over said upper surface and the metal layer;
   over the cap layer, a second dielectric layer having a second upper surface;
   a via hole, having a second width less than said first width, in the shape of a broken line hollow square that is disposed to lie entirely within the first hollow square and that extends below said second upper surface, through the second dielectric layer and the cap layer, to the metal layer; and
   an aluminum bonding pad on said second upper surface that fills and fully overlaps the via hole.

2. The structure of claim 1 wherein the metal is copper or a copper manganese alloy or a copper aluminum alloy.

3. The structure of claim 1 wherein said first trench width is between about 1 and 10 microns.

4. The structure of claim 1 wherein the depth of the first trench is between about 0.5 and 2 microns.

5. The structure of claim 1 wherein said via hole width is between about 0.5 and 9 microns.

6. A bonding pad, comprising:
   a partially completed silicon integrated circuit that includes an uppermost layer of a first dielectric material having a first upper surface;
   a first trench, having a first width, in the shape of a hollow square that extends downwards from said first upper surface to a depth;
   a barrier layer over the upper surface, including the first trench;
   a metal layer that just fills the first trench;
   a cap layer over said upper surface and the metal layer;
   over the cap layer, a second dielectric layer having a second upper surface;
   a plurality of via holes, each having a second width less than said first width, separated from one another by a distance and arranged in the shape of a hollow square that lies entirely within the first hollow square, all said square via holes extending below said second upper surface, through the second dielectric layer and the cap layer, to the metal layer; and
   an aluminum bonding pad on said second upper surface that fills and fully overlaps the second trench.

7. The structure of claim 6 wherein the metal is copper or a copper manganese alloy or a copper aluminum alloy.

8. The structure of claim 6 wherein the width of a square via hole is between about 0.5 and 9 microns.

9. The structure of claim 6 wherein the separation distance between the square via holes is between about 0.5 and 1 microns.

10. The structure of claim 6 wherein the second dielectric layer further comprises a layer of silicon oxide having a thickness between about 0.5 and 1 micron covered by a layer of silicon nitride having thickness between about 0.5 and 1 micron.

* * * * *